(12) United States Patent
Gunda et al.

(10) Patent No.: US 12,270,104 B2
(45) Date of Patent: Apr. 8, 2025

(54) SUBSTRATE WITH FLUORINATED YTTRIUM COATINGS, AND METHODS OF PREPARING AND USING THE SUBSTRATES

(71) Applicant: ENTEGRIS, INC., Billerica, MA (US)

(72) Inventors: Nilesh Gunda, North Chelmsford, MA (US); Jayasri Narayanamoorthy, Acton, MA (US); Carlo Waldfried, Middleton, MA (US)

(73) Assignee: ENTEGRIS, INC., Billerica, MA (US)

( * ) Notice: Subject to any disclaimer, the term of this patent is extended or adjusted under 35 U.S.C. 154(b) by 374 days.

(21) Appl. No.: 17/696,101

(22) Filed: Mar. 16, 2022

(65) Prior Publication Data

US 2022/0298639 A1  Sep. 22, 2022

Related U.S. Application Data

(60) Provisional application No. 63/163,589, filed on Mar. 19, 2021.

(51) Int. Cl.
| | |
|---|---|
| *C23C 16/56* | (2006.01) |
| *C23C 14/08* | (2006.01) |
| *C23C 16/40* | (2006.01) |
| *C23C 16/455* | (2006.01) |
| *H01L 21/02* | (2006.01) |

(52) U.S. Cl.
CPC ...... *C23C 16/45553* (2013.01); *C23C 14/083* (2013.01); *C23C 16/405* (2013.01); *C23C 16/56* (2013.01); *H01L 21/02274* (2013.01); *H01L 21/0228* (2013.01)

(58) Field of Classification Search
CPC ............ C12N 15/1034; C12N 15/1093; C12Q 1/6837; C12Q 2522/101; C12Q 2523/125; G01N 33/5308; Y10S 436/809; B29C 2045/445; B29C 45/26; B29C 45/44
See application file for complete search history.

(56) References Cited

U.S. PATENT DOCUMENTS

| | | |
|---|---|---|
| 6,924,226 B2 | 8/2005 | Cohen |
| 6,974,771 B2 | 12/2005 | Chen |
| 7,049,226 B2 | 5/2006 | Chung |
| 8,962,473 B2 | 2/2015 | Kuo |
| 9,177,858 B1 | 11/2015 | Zhang |
| 10,563,304 B2 | 2/2020 | Xie |
| 10,755,900 B2 | 8/2020 | Tran |
| 2010/0168404 A1 | 7/2010 | Girolami et al. |
| 2016/0273095 A1 | 9/2016 | Lin |

(Continued)

FOREIGN PATENT DOCUMENTS

| | | |
|---|---|---|
| GB | 2455993 B | 9/2012 |
| JP | 2007217782 A | 8/2007 |

(Continued)

OTHER PUBLICATIONS

CN 113913783 (Waldfried et al.) (Year: 2022).*

*Primary Examiner* — Lawrence D Ferguson

(57) ABSTRACT

Described are substrates that include high aspect ratio surfaces and non-high aspect ratio surfaces, at least two coatings, one coating at high aspect ratio surfaces and a second coating at non-high aspect ratio surfaces, and having fluorinated outer surfaces; methods of preparing these coatings; and substrates, surfaces, equipment, and components of equipment that include the coatings.

15 Claims, 4 Drawing Sheets

FRONT

SIDE

(56) References Cited

U.S. PATENT DOCUMENTS

| | | |
|---|---|---|
| 2018/0016678 A1 | 1/2018 | Fenwick |
| 2018/0202047 A1 | 7/2018 | Lin |
| 2019/0185997 A1 | 6/2019 | Lin |
| 2019/0382888 A1 | 12/2019 | Wu |
| 2020/0131634 A1 | 4/2020 | Gao |
| 2020/0347497 A1 | 11/2020 | Shanbhag |
| 2022/0157568 A1 | 5/2022 | Wu et al. |

FOREIGN PATENT DOCUMENTS

| | | |
|---|---|---|
| KR | 20210025708 A | 3/2021 |
| WO | 2016131024 A1 | 8/2016 |
| WO | 2020180569 A1 | 9/2020 |
| WO | 2021029970 A1 | 2/2021 |

\* cited by examiner

COLOR LEGEND

| | |
|---|---|
| ▓ | SUBSTRATE (100) |
| ▓ | ALD Al2O3 (105) |
| ▓ | ALD Y2O3 (120) |
| ▓ | FLUORINATED ALD Y2O3 (122) |
| ▓ | ALD COMPOSITE (Y2O3+Al2O3) (140) |
| ▓ | FLUORINATED ALD COMPOSITE (Y2O3+Al2O3) (142) |
| ▓ | PVD Y2O3 (130) |
| ▓ | FLUORINATED PVD Y2O3 (132) |

SUBSTRATE WITH FLUORINATED YTTRIUM COATINGS, AND METHODS OF PREPARING AND USING THE SUBSTRATES

PRIORITY

This application claims priority to U.S. Provisional Patent Application Ser. No. 63/163,589 filed on Mar. 19, 2021, the entire disclosure of which is incorporated herein by reference.

FIELD

The present description relates to substrates that include high aspect ratio surfaces and non-high aspect ratio surfaces, at least two coatings, one coating at high aspect ratio surfaces and a second coating at non-high aspect ratio surfaces, and having fluorinated outer surfaces; methods of preparing these coatings; and substrates, surfaces, equipment, and components of equipment that include the coatings.

BACKGROUND

Semiconductor and microelectronic device manufacturing methods require various processing steps that involve highly reactive process materials such as plasmas, acids, accelerated ions, etchants (e.g., halogens and halogenated materials), corrosive materials, and cleaning agents, among others.

Example processes performed on semiconductor and microelectronic devices include ion implantation processes (e.g., "doping" processes), etching processes that may use a plasma or a halogen material, cleaning processes, and deposition steps, among others, each of which can include the use of a reactive, corrosive, or high energy process material within a "process chamber." Each of these types of processes is performed at an interior of a process chamber that contains a workpiece (e.g., "substrate") and the process materials. The process chamber also includes various structures and components (sometimes referred to herein as "process chamber components" or "process tool components" for short) that define the process chamber and items internal to the process chamber or items associated with the chamber, and that are required for operation. These process chamber components may include chamber walls, flow conduits (e.g., flow lines, flow heads, piping, tubing, and the like), electrical components (e.g., electrodes), fasteners, trays, supports, and other structures and devices that are used to support a workpiece or to deliver, contain, operate on, or otherwise contact a reactive process material for use within the process chamber.

For use as part of a process chamber, a process tool component should be resistant to the reactive process materials that will be used within the process chamber. A process chamber component should not become degraded or damaged by contact with the process materials, especially in a manner that would produce debris or particulates that may become incorporated into the process that is being performed and potentially contaminate a workpiece being processed.

Process chamber components used in semiconductor processing equipment for manufacturing semiconductor and microelectronic devices are frequently made of a solid material (a "substrate" or a "base") such as a metal (e.g., stainless steel, aluminum alloy which may optionally be anodized, tungsten), a mineral, or ceramic material, etc. The substrate is usually coated with a protective layer that is more resistant to reactive process materials than is the substrate material. In the past, such protective coatings have typically been placed onto a substrate surface by various useful methods, typically by a process of anodizing (e.g., to produce anodized aluminum), spray coating, or a deposition method such as physical vapor deposition (PVD), chemical vapor deposition (CVD), atomic layer deposition (ALD), or a modification or derivative of one of those.

SUMMARY

The following description relates to coated substrates that have at least two different coatings on surfaces of the substrate, with each coating containing or being derived from yttrium oxide and with outer surfaces of the coated substrate being fluorinated, as well as related processes, and methods of using the coated substrates.

The two different coatings are applied to produce protective coatings at different portions of a substrate surface that contains three-dimensional, high aspect ratio features. One coating is non-directional and is deposited onto surfaces (referred to as "high aspect ratio surfaces") of the substrate that may be difficult to coat by various deposition methods, especially methods that are effective only to deposit materials at "line-of-sight" locations of a substrate. This coating of the combination may be applied by a non-directional, atomic layer deposition technique, and may be effective to deposit materials at surfaces of three-dimensional, high aspect ratio features of a substrate, i.e., at high aspect ratio surfaces.

A different coating can be applied to portions of the substrate surface other than the surfaces of the three-dimensional, high aspect ratio features, i.e., at "non-high aspect ratio surfaces." This coating, sometimes referred to as a "partial" coating herein, can be applied to surfaces of a substrate that require a high amount of protection from process chemicals during use of the substrate. The coating may be applied by a directional, "line-of-sight" deposition method.

Each coating comprises or may be derived from a deposited layer that contains yttrium oxide ("yttria" or "Y2O3"). Surfaces of one or more of the coatings, after being deposited, may be processed by a fluorination step to be at least partially fluorinated to form yttrium fluoride ("YF3") or fluorinated yttrium oxide ("YOF").

In one aspect, the invention relates to a coated substrate having at least two coatings. The substrate comprises high aspect ratio surfaces of a feature having an aspect ratio of at least 2 to 1, and non-high aspect ratio surfaces. The coatings include: a first yttrium oxide coating that covers at least high aspect ratio surfaces; a second yttrium oxide coating that covers at least non-high aspect ratio surfaces; and fluorinated yttrium oxide at outer portions of coatings located at the high aspect ratio surfaces, and at outer portions of coatings located at the non-high aspect ratio surfaces.

In another aspect, the invention relates to a method of coating a substrate that includes high aspect ratio surfaces and non-high aspect ratio surfaces. The method comprises: depositing an atomic layer deposition yttrium oxide coating at least at high aspect ratio surfaces; before or after depositing the atomic layer deposition yttrium oxide coating, depositing a non-atomic layer deposition yttrium oxide coating at least at non-high aspect ratio surfaces; fluorinating exposed surfaces of one or both coatings at high aspect ratio surfaces and at non-high aspect ratio surface.

Figures 1, 2A:
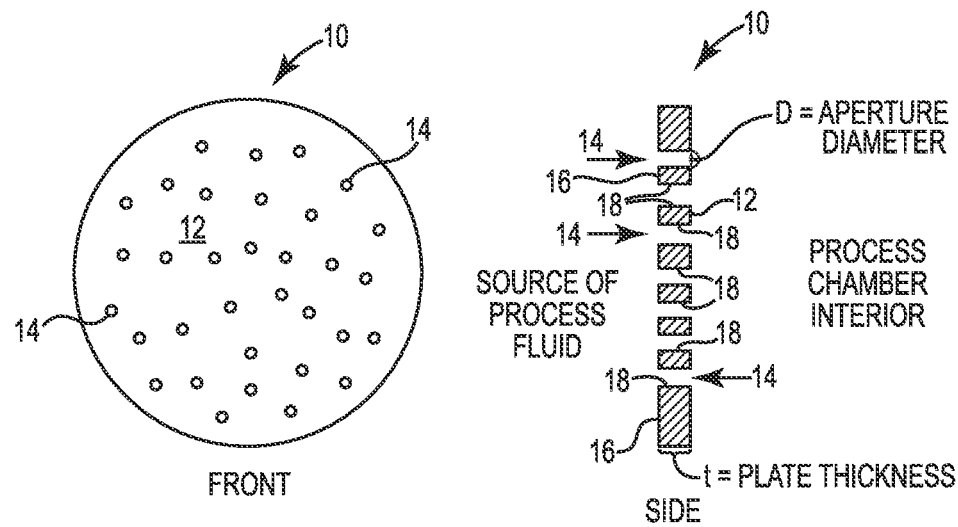
FIG. 1 shows views of an example substrate as described.
FIGS. 2A through 2G show example coated substrates prepared by methods of the present description, and a related legend (FIG. 2A).

All figures are schematic and not to scale.

DETAILED DESCRIPTION

The following description relates to coated substrates that have at least two coatings on surfaces of the substrate, wherein the substrate has high aspect ratio surfaces, and non-high aspect ratio surfaces. Each coating can contain yttrium in combination with oxygen, fluorine, or both oxygen and fluorine. The coatings, which can comprise and are derived from deposited yttrium oxide layers, and optionally are fluorinated, may be referred to generally herein as "yttrium oxide coatings," even if a portion or all of the yttrium oxide of the coating has been fluorinated. The description also relates to the use of two or more different yttrium oxide coatings as protective coatings on surfaces of a substrate that includes high aspect ratio surfaces, and to process equipment that comprises a substrate that includes a combination of yttrium fluoride coatings as described.

A substrate as described includes a combination of two or more yttrium oxide coatings. One coating is located to cover surfaces of three-dimensional, high aspect ratio features of the substrate. This coating is applied by a multi-directional coating method such as an atomic layer deposition technique that is effective to deposit a layer of yttrium oxide-containing material onto surfaces that cannot be easily coated with other coating methods, such as "line-of-sight" coating techniques. A coating that covers high aspect ratio features of the substrate does not need to be particularly thick, especially a coating that is deposited onto a high aspect ratio surface, such as a surface of a small circular opening of a flow distribution device (e.g., showerhead), having small dimensions. In those situations the coating can preferably have a thickness that is sufficiently low to not unduly affect the size or shape of the structure, especially in a manner to avoid undesirably affecting the performance properties (e.g., flow properties) of the structure.

According to certain example methods and coated substrates, the coating that is deposited onto the surfaces of three-dimensional, high aspect ratio features of the substrate ("high aspect ratio surfaces") may be in the form of an "encapsulating coating" that covers all surfaces of a substrate. In example embodiments, an encapsulating coating covers at least 95, 98, or 99 percent of a total amount of surface area of a substrate.

Another coating of a combination of coatings as described may be a coating that covers portions of the substrate that are not part of a high aspect ratio feature of the substrate, also referred to herein as "non-high aspect ratio surfaces." This coating can be applied to surfaces of the substrate that during use are exposed to reactive chemicals ("process materials" or "process chemicals") that are capable of physically or chemically degrading a surface of a substrate. In some embodiments, the coating on the non-high aspect ratio surfaces is performed using a directional or "line-of-sight" type techniques. Examples of useful techniques include, but are not limited to physical vapor deposition techniques (e.g., sputtering) and chemical vapor deposition techniques (e.g., plasma-enhanced chemical vapor deposition). In some embodiments, coating deposited by line-of-sight techniques also coat a portion of the high aspect ratio surfaces. In some embodiments, the combination of coatings applied by line-of-sight techniques and multidirectional techniques ensures that both high aspect ratio surfaces and non-high aspect ratio surfaces are fully coated in a manner that is difficult to achieve by use of line-of-sight techniques alone and is more efficiently achieved than through multidirectional techniques alone.

The combination of coatings as described includes two different protective, chemically inert coatings that combine to cover different surfaces of the substrate, to protect those surfaces and prevent or reduce degradation of the substrate surfaces that would be caused by direct contact of the substrate surface with the process material. The combination of coatings has an outermost surface that is fluorinated at both high aspect ratio surfaces and non-high aspect ratio surfaces. In some embodiments, the outermost surface of the combination of coatings can be entirely deposited by multidirectional techniques. In other embodiments, the outermost surface of the combination of coatings can have portions deposited by multidirectional techniques and portions deposited by line-of-sight techniques. In example uses, a combination of these two types of yttrium oxide coatings may perform as a protective fluorinated coating over various surfaces of a substrate, that is chemically resistant to reactive chemicals (process materials) used in methods of processing semiconductor or microelectronic devices.

A combination of yttrium oxide coatings as described can be useful for protecting substrates that contain surface features that are three-dimensional in form, especially substrates that include one or more three-dimensional surface features that exhibit a high aspect ratio. As an example, one coating of a combination of coatings applied to the substrate is capable of being deposited onto surfaces of one or more high aspect ratio features of the substrate. These may include various three-dimensional structures that may form or include secondary substrate surfaces that extend below a primary surface (e.g., an "upper," "predominant," or "major" surface) of a substrate, and that are sheltered, protected, partially-enclosed, or otherwise exhibit a reduced level of accessibility for depositing a coating onto the surface.

A "primary" surface can be a surface of a substrate that covers a substantial or predominant amount of a substrate and that does not define features that exhibit a high aspect ratio. The primary surface might be considered an "upper" or a "lower" surface of a substantially two-dimensional structure such as a planar or curved sheet or plate. A primary surface may be a substantially planar or curved surface that extends over a length and a width, the surface being different from any three-dimensional structures also present as part of the substrate, such as a hole, channel, opening, trench, etc., but that may have boundaries (edges) that are connected to or that define boundaries of one or more three-dimensional structures such holes, channels, openings, trenches, etc., that may define and include high aspect ratio surfaces. A primary surface will include surfaces that are not part of a high aspect ratio feature, and will include "non-high aspect ratio" surfaces.

The surfaces that define the three-dimensional structures, which are also sometimes referred to as "secondary surfaces," are the surfaces that are formed in or located below the primary surface as part of the substrate. These "secondary" surfaces are more difficult for a material to contact during a deposition step, for the material to become deposited as a coated material. Secondary surfaces may be surfaces that define a sidewall or a bottom structure of a three-dimensional structure such as: a hole, well, trench, or channel that is formed in and extends below the primary surface. A three-dimensional structure that includes the secondary surfaces may have dimensions characteristic of a "high aspect ratio" feature, such as a depth dimension (below an upper (primary) surfaces of a substrate) that is equal to or greater than a cross-sectional (e.g., width) dimension of the structure, in which case the surfaces of the three-dimensional structure may be referred to as "high aspect ratio" surfaces.

To form a protective coating on a substrate surface that contains three-dimensional structure, e.g., defined by a primary surface and secondary surfaces, with the coating uniformly covering surfaces (primary surfaces and secondary surfaces) of the substrate, a combination of coatings as described includes one coating that is deposited onto surfaces of three-dimensional structures, including high aspect ratio surfaces that are part of a high aspect ratio structure, and a second coating that is deposited onto surfaces that are not part of a high aspect ratio structure, e.g., a second coating that is deposited onto one or more primary surfaces of the substrate or non-high aspect ratio surfaces.

Coatings as described can be included on any surface or substrate that includes surface features in three-dimensions, including three-dimensional surfaces that have a high aspect ratio, and that may desirably include a protective (e.g., chemically inert, non-reactive) coating. A combination of coatings may be formed on a substrate to form a "coated article" (such as a coated process tool component) with the coatings being applied to surfaces of the substrate in a solid continuous or semi-continuous form, to provide a chemically resistant barrier coating over substrate surfaces. The coatings can be applied to high aspect ratio surfaces, to non-high aspect ratio surfaces, and may optionally be applied to all surfaces of a substrate or only to portions of a substrate. For example, a substrate in the form of a plate with apertures, that includes two opposed sides and apertures extending through the thickness of the plate, may be coated at surfaces of the opening, and additionally on one side of the plate, optionally on both opposed sides of the plate.

Example substrates include components of process chambers ("process tool components") that are used for preparing semiconductor materials, microelectronic devices, and the like. Coatings of the present description, deposited over surfaces of the substrate, will be exposed to process chemicals (reactive chemicals such has halides, plasma, acids, and the like) during use of the coated substrate in a process tool. Being resistant to damage (physical or chemical degradation) due to contact with the process chemicals, coatings as described can be used on surfaces of a process tool component of a process chamber that will contain these and other process materials, with reduced degradation and particle or debris formation caused at the substrate surface during use of the process tool component.

Atomic layer deposition (ALD) techniques for depositing coatings onto surfaces of a substrate are particularly useful for applying uniform, conformal coatings onto surfaces that have features in two or three dimensions, especially for applying coatings onto high aspect ratio surfaces that include three-dimensional structures with some surfaces being small or inaccessible to other types of deposition methods, which can be characteristic of structures considered to exhibit a high aspect ratio.

Atomic layer deposition techniques are performed by placing a substrate within an environment of a non-directional cloud of gaseous material that will contact and become deposited onto surfaces of the substrate. Chemical material of the non-directional cloud becomes deposited as a highly conformal, uniform-thickness coating at all surfaces of the substrate that are exposed to the deposition environment. A material can be deposited using atomic layer deposition techniques onto surfaces that are not accessible by "line-of-sight" deposition techniques (which are deposition techniques that deposit material only onto surfaces that fall directly along an un-obstructed path (or "line-of-sight") between the surface and a source of material to be deposited onto the surface). Consequently, atomic layer deposition techniques are useful to deposit coatings onto all surfaces of a three-dimensional substrate, including surfaces of three-dimensional structures, and specifically including surfaces of high aspect ratio features of a substrate (high aspect ratio surfaces).

Example high aspect ratio surfaces include surfaces of holes (including holes that have a narrow opening and a depth that is greater than the size of the opening), channels, wells, internal plenums, tortuous or convoluted paths, open cell foams or matrixes, and porous membranes, scrims, or fabrics. Example substrate surfaces may include features that have an aspect ratio of at least 2:1, 5:1, 10:1, 15:1, 20:1, 30:1, 40:1, 50:1, 100:1, 200:1, or even 500:1. In particular, this includes openings, apertures, or wells that have a depth (e.g., thickness) and an width (e.g., diameter), wherein the aspect ratio is defined as the depth to width, and may be at least 20:1, 50:1, 100:1, 200:1, or even 500:1, and wherein the size of the opening, aperture, or well at a surface is relatively small, such as less than 2 millimeters, e.g., less than 1 millimeter or less than 0.5 millimeter. Thus, as used herein, a "high aspect ratio surface" is a feature in a surface having a depth (e.g., thickness) to width (e.g., diameter) ratio of at least 2:1, 5:1, 10:1, 15:1, 20:1, 30:1, 40:1, 50:1, 100:1, 200:1, or even 500:1. As used here, a "non-high aspect ratio surface" is a surface that is not a high-aspect ratio surface.

A coating formed by atomic layer deposition (also referred to herein as an "atomic layer deposition coating") may typically, but not necessarily, be formed to cover all exposed surfaces of a substrate (also including primary surfaces that are different from the three-dimensional, high aspect ratio surfaces) during a single deposition process. When an atomic layer deposition coating is deposited over all surfaces of a substrate, including all surfaces of three-dimensional features that exhibit a high aspect ratio, and all other (non-high aspect ratio surfaces), the coating can be referred to herein as an "encapsulating coating."

According to an example method of forming an yttrium oxide coating at surfaces of a substrate, including surfaces of three-dimensional, high aspect ratio features of the substrate, an atomic layer deposition technique may be used to place a non-fluorinated yttrium oxide precursor coating onto the substrate surfaces, including the three-dimensional, high aspect ratio features of the substrate. Yttrium oxide ($Y_2O_3$, a.k.a., "yttria") is prepared from and contains yttrium and oxygen in relative amounts (atomic) of approximately 2:3 (yttrium:oxygen).

An yttrium oxide coating can contain other metals or metal oxides in addition to yttrium oxide, either chemically separate from or in chemical association with the yttrium oxide. For example, an yttrium oxide coating may contain a metal such as aluminum, zirconium, titanium, cerium, or erbium, or an oxide of one of these metals, e.g., aluminum oxide, zirconium oxide, titanium oxide, cerium oxide, or erbium oxide. In example forms, an yttrium oxide coating can be a composite of yttrium oxide and another non-yttrium metal oxide, such as aluminum oxide. The composite material contains both of the two different chemical materials, each in its molecular oxide form, as a "composite" of the two types of metal oxides. During a fluorination step, fluorine combines with the yttrium oxide to form fluorinated yttrium oxide, while the non-yttrium oxide (e.g., aluminum oxide) material of the composite typically does not become fluorinated.

Methods of forming yttrium oxide coatings by atomic layer deposition are known. See, e.g., United States Patent Publication 2018/0202047. By example methods, an yttrium oxide coating may be deposited as a single layer of a desired thickness, or as multiple layers that combine to form a coating of a desired total thickness. Generally, as non-limiting examples, a thickness of a single deposited layer of an yttrium oxide coating may be in a range from less than 1 nanometer to a few or several nanometers, e.g., about 0.1, 0.5, 1, 2, 5, or 10 nanometers, up to tens or hundreds of nanometers, e.g., up to or in excess of 50, 100, 500, 600, 800, or 900 nanometers (0.9 micron). One or multiple layers may be applied to produce a desired total thickness of an yttrium oxide coating, which may be in a range from 1, 5, or 10 nanometers, up to 100, 500, or 1000 nanometers (1 micron).

Examples of atomic layer deposition yttrium oxide coatings may contain, consist of, or consist essentially of yttrium oxide. Other examples may contain, consist of, or consist essentially of yttrium oxide and one or more other metal oxides such as aluminum oxide. A material or structure that consists essentially of one or a combination of ingredients is considered to be a material or structure that contains the named ingredient or combination of ingredients and not more than an insignificant amount of other materials, e.g., not more than 3, 1, 0.5, or 0.1 weight percent of ingredients different from the named ingredient or combination of ingredients.

By example methods, an yttrium oxide coating may be deposited as multiple deposited layers, each of a very low thickness, e.g., of thicknesses on a molecular, atomic, or monolayer scale, or greater. The multiple individual deposited layers can be deposited to produce a coating of a desired total thickness. By these example methods, the precursor yttrium oxide coating can contain yttrium oxide alone or in combination with another non-yttrium oxide metal oxide. The non-yttrium oxide metal oxide may be deposited as multiple layers of the non-yttrium oxide material placed between individual yttrium oxide layers. Thicknesses of individual layers (of yttrium oxide, of a metal oxide other than yttrium oxide, or of a combination of these) may be as desired, e.g., in a range from less than 1 nanometer to a few or several nanometers, e.g., about 0.1, 0.5, 1, 2, 5, or 10 nanometers, or larger. One or multiple layers (of yttrium oxide, of a metal oxide other than yttrium oxide, or of a combination of these) may be applied to produce a desired total thickness of an yttrium oxide coating, which may be in a range from 1, 5, or 10 nanometers, up to 100, 500, or 1000 nanometers (1 micron).

In addition to a coating that is applied to surfaces of high aspect ratio features of a substrate, a coated substrate as described also includes an additional coating that is deposited at surfaces other than the surfaces of high aspect ratio features, i.e., the additional coating covers other (non-high aspect ratio) surfaces that are more substantially flat or only slightly curved and that are not part of a high aspect ratio feature, however in some embodiments, the additional coating can cover at least some portion of the high aspect ratio surface. This additional coating, sometimes referred to as a "partial" coating in that if applied to high aspect ratio surfaces many not fully, evenly, or uniformly coat the high aspect ratio surfaces, can be applied selectively to surfaces of a substrate that will specifically require a relatively high level of chemical resistance during use of the substrate. For example, a partial coating may be applied to surfaces of a substrate that during use experience a high amount of contact with process chemicals at an interior of a process chamber used for processing a semiconductor or microelectronic device. The partial coating can have a thickness that is greater than the coating applied to surfaces of high aspect ratio features (applied by atomic layer deposition), and will provide extended resistance against contact between the underlying substrate surface and process chemicals, at portions of the substrate surface that will experience high levels of exposure to process chemicals during use.

A partial coating may be prepared by a method that is useful to prepare a relatively thicker coating over a surface that is flat or curved surface, and that does not exhibit a high aspect ratio. A partial coating may be produced by a deposition technique that deposits material on a directional or "line-of-sight"-type techniques, which may not fully, uniformly, or evenly deposit material onto surfaces of a high aspect ratio feature of a substrate, such as "secondary surfaces" described herein. Examples of useful techniques include, but are not limited to, physical vapor deposition techniques (e.g., sputtering), chemical vapor deposition techniques (e.g., plasma-enhanced chemical vapor deposition).

A partial coating can be formed at non-high aspect ratio surfaces of a substrate by placing a non-fluorinated yttrium oxide coating of a desired thickness, onto the substrate surfaces. Optionally, the coating can subsequently be fluorinated to cause fluorination of a portion of the coating. The coating contains yttrium oxide alone or in combination with another (non-yttrium oxide) metal oxide. The fluorination step converts at least a portion of the yttrium oxide to fluorinated yttrium oxide (YOF) or yttrium fluoride (YF3), to form a resultant fluorinated yttrium oxide coating.

A partial coating can have a thickness that provides a high degree of chemical resistance to a substrate, particularly at primary, non-high aspect ratio surfaces that will be exposed to high amounts of process chemicals during use of the substrate. Example thicknesses may be at least 1 micron, for example a thickness of from 1, 2, 5, or 10 microns, up to 10, 20, 25, 50, or 100 microns.

Optionally, according to example methods and coatings, before deposition of yttrium oxide as a precursor coating, a substrate surface may be coated with an intermediate layer (a.k.a. a "buffer layer") that will improve performance of the described combination of coatings. A buffer layer may be included at a substrate surface to prevent physical damage to the yttrium oxide coating that may be caused by thermal stressing that occurs during a subsequent step, such as a fluorination step. A buffer layer can be effective to improve the ability of an yttrium oxide precursor coating to be processed by a fluorination step, at high temperature, without causing the yttrium oxide layer to crack due to stresses caused by the high processing temperature of a fluorination step, e.g., at a temperature in excess of 300 degrees Celsius experienced during a fluoro-annealing step. A buffer layer may be particularly useful when the substrate is a metal, such as aluminum or an aluminum alloy.

A buffer layer may be any layer that is effective to reduce or prevent undesired physical effects of thermal stresses experienced by a deposited yttrium oxide precursor coating, preferably to prevent cracking or other physical damage to a deposited yttrium oxide coating from occurring during a fluoro-annealing step. The composition, thickness, and method of preparing the buffer layer may be any that are useful to prepare an effective buffer layer. Examples of buffer layers may be made of ceramic materials such as metal oxides, e.g., aluminum oxide, titanium oxide, zirconium oxide, and the like. Example thicknesses may be in a range from 25 to 300 nanometers, e.g., from 50 to 200 or 250 nanometers. An example buffer layer may be applied to a substrate surface by any technique that is effective to allow the buffer layer to function as described. Particular example techniques include chemical vapor deposition, physical vapor deposition, and atomic layer deposition techniques.

After depositing one or a combination of yttrium oxide coatings, deposited yttrium oxide coating or combination of coatings is processed by a fluorination step, such as a fluorine annealing step ("fluoro-annealing" step) that converts at least a portion of the total amount of yttrium oxide of the deposited coating to yttrium fluoride ($YF_3$) or yttrium oxyfluoride (YOF). The fluorination step will cause yttrium oxide located at least at and near exposed surface portions of an yttrium oxide coating to be converted, at least in part, to a fluorinated yttrium material such as yttrium fluoride or yttrium oxyfluoride. Methods of fluorinating yttrium oxide and yttrium oxide-containing materials (e.g., aluminum yttrium oxide), and related articles, are described, for example, in United States Patent Publication Numbers 2016/0273095 and 2018/0202047, the entireties of each of these being incorporated herein by reference.

A fluoro-annealing step can be performed at a temperature and for a time that is effective to convert at least a substantial portion of yttrium oxide of a deposited yttrium oxide precursor film to yttrium oxide (YOF) or to yttrium fluoride ($YF_3$), especially at a surface portion of the deposited yttrium oxide precursor coating.

Useful and preferred fluoro-annealing techniques include steps of exposing an yttrium oxide surface to molecular fluorine source vapor at a temperature that causes fluorine of the molecular fluorine source vapor to react with yttrium oxide of the deposited yttrium oxide coating (a.k.a., "yttrium oxide layer") to form yttrium fluoride or yttrium oxyfluoride, or a combination thereof, at and below a surface of the deposited yttrium oxide precursor coating.

As used herein, a "molecular fluorine source vapor" is a non-plasma (i.e., molecular) fluorine-containing chemical molecule that is in vapor (gaseous) form, that is not considered a plasma. A "plasma" is a non-solid, vapor phase composition that contains a high density of ionic fragments derived from one or more plasma precursor compounds that have been deliberately exposed to energy (e.g., from a radio frequency power source) for the purpose of breaking down the plasma precursor compound into the ions, to use the ions for processing a workpiece. In contrast to a plasma, a useful or preferred molecular fluorine source vapor may contain less than 1×10 E-5 atomic percent ionized materials, such as less than 1×10 E-6 atomic percent ionic species.

A molecular fluorine source vapor may be provided to a process chamber for forming an yttrium fluoride coating by any method or from any useful and effective source or location. In useful or preferred methods, molecular fluorine source vapor may be produced in situ, meaning during a process of forming an yttrium fluoride coating on a surface of a substrate, and within the process chamber used for forming the yttrium fluoride coating on the surface. The molecular fluorine source vapor may be generated in situ from a non-gaseous fluorine source by heating the non-gaseous fluorine source to cause molecules of the non-gaseous fluorine source to become gaseous, i.e., a molecular vapor. The non-gaseous fluorine source may be a liquid or a solid fluorine-containing substance, and the heating step produces the gaseous form of the molecules without causing significant degradation or ionization of the molecules of the liquid or solid fluorine source. A useful or preferred gaseous form of the molecules may be at least 99.9999 atomic percent molecular, i.e., non-chemically-changed molecules of the liquid or solid fluorine-containing substance. The gaseous form of the molecules may contain less than 1×10 E-5 atomic percent ionized or degraded materials, such as less than 1×10 E-6 atomic percent ionic species. In some embodiments, the fluorine vapor source can be introduced as a gaseous medium from a gas cylinder to a fluorination reactor.

The heating step that produces a molecular fluorine source vapor is distinct from a step of generating plasma, which is used in various semiconductor processing steps. In general, plasma-generating steps involve applying one or more forms of energy to a plasma source, which is generally a gaseous chemical substance, to ionize the plasma source and chemically degrade molecules of the plasma source to produce ionic fragments of the molecules. The energy may be heat energy (elevated temperature), electromagnetic radiation such as RF (radiation) (produced by a radio frequency power source), or combinations of these.

As a specific comparison, a heating step used to produce a molecular fluorine source vapor is different from a step of generating fluorine-containing plasma for use in a semiconductor processing tool for a step of plasma etching, plasma cleaning, or "seasoning" a process chamber of a semiconductor processing tool. An example of a plasma-generating step that is different from the presently-described heating step is described in U.S. Pat. No. 5,756,222, which describes a fluorine-containing plasma generated in a reaction chamber designed for a plasma etch or plasma cleaning process. The plasma is prepared by exposing a fluorine precursor to RF power.

A fluoro-annealing step can be performed in a process chamber, at elevated temperature, by: locating a substrate at an interior of the process chamber in a removable, temporary, non-operational manner, the substrate having a surface that includes a deposited yttrium oxide coating deposited thereon; dispensing molecular fluorine source vapor into the process chamber or generating molecular fluorine source vapor within the process chamber by heating non-gaseous fluorine source to cause molecules of the non-gaseous fluorine source to become gaseous, i.e., a vapor, within the process chamber; and elevating the temperature of the process chamber, the substrate, the deposited yttrium oxide coating, the molecular fluorine source vapor, or a combination thereof to cause a reaction between fluorine of the molecular fluorine source vapor and yttrium oxide of the deposited yttrium oxide coating to convert at least a portion of the yttrium oxide to fluorinated yttrium oxide. As used herein, the term "fluorinated yttrium oxide" refers to an yttrium oxide coating that has been processed by a fluorination step to convert at least a portion of the yttrium oxide to yttrium fluoride ($YF_3$), yttrium oxyfluoride (YOF), or to a combination of both. In some embodiments, the fluorine source vapor is heated independently from and/or to a different temperature than the yttrium oxide coated substrate.

During a fluoro-annealing step, the process chamber used to perform the step may contain processing materials that include the molecular fluorine source vapor, optionally a non-vapor fluorine source, and one or more substrates that have a deposited yttrium oxide coating, as described herein, deposited at a surface. The interior space and atmosphere of the chamber need not be evacuated or at a reduced pressure, and may contain an amount of atmospheric air. There is no need to eliminate air or oxygen or to introduce an inert gas (purge gas, e.g., $N_2$) into the process chamber for the fluoro-annealing step. The process chamber need not contain and may exclude any other additional gaseous or liquid processing materials besides air and the molecular fluorine source vapor, e.g., may exclude other gaseous materials such as an inert gas or a gaseous co-reactant, which may sometimes be used in a gaseous atmosphere of other semiconductor processing steps.

The process chamber is not part of a semiconductor processing tool and need not contain and preferably does not contain any other workpiece such as a semiconductor device, microelectronic device, or a precursor thereof, that is being otherwise processed. The process chamber also does not require and does not involve the use of a means for generating plasma, such as a radio frequency power source or means for applying an electrical potential (voltage) to a component or workpiece.

A useful process chamber can preferably include: temperature control to control temperature within the chamber; means to control the composition and purity of the environment at the interior of the chamber, such as pressure controls, filters, etc.; components to temporarily contain and support one or multiple substrates, each having a combination of deposited yttrium oxide coatings at a surface, within the chamber for a period useful to convert at least a portion of the yttrium oxide of an exposed surface of at least one of the deposited yttrium oxide coatings to fluorinated yttrium oxide; and components to control the composition of an atmosphere within the process chamber, including to supply and control the amount and concentration the molecular fluorine source within the process chamber.

According to certain useful or preferred example fluoro-annealing methods, a molecular fluorine source vapor can be a gaseous fluorinated or perfluorinated organic compound such as a fluorinated or perfluorinated alkane or alkene, any of which may be straight or branched. Examples include $CF_4$, $C_2F_4$, $C_3F_6$, $C_4F_8$, $CHF_3$, $C_2H_2F_2$, $C_2F_6$, HF, $CH_3F$, among others, each in a molecular form, meaning substantially non-ionic and not processed (by adding energy other than heat) to degrade or form plasma.

According to other useful or preferred example methods, a molecular fluorine source vapor can be a gaseous fluorinated polymer that has not been processed with energy to form plasma. A gaseous fluorinated polymer can be derived from a non-gaseous (e.g., liquid or solid) fluorinated polymer by heating the non-gaseous fluorinated polymer, for example in a process chamber and in the presence of a deposited yttrium oxide coating, which is desired to be converted to yttrium fluoride by the fluoro-annealing step.

The fluorinated polymer may be any fluorinated polymer that will be effective according to a method as described for forming fluorinated yttrium oxide from a deposited yttrium oxide coating present on a surface of a substrate. Examples of useful fluorinated polymers include homopolymers and copolymers that include polymerized fluoroolefin monomers and optional non-fluorinated co-monomers. A polymer may be fluorinated (i.e., partially fluorinated), perfluorinated, or may include non-fluorine halogen atoms such as chlorine. A molecular fluorine source may be liquid or solid at room temperature, but will become a vapor at a temperature of a process chamber used according to a method as described.

Non-limiting examples of specific fluoropolymers include: polymerized perfluoroalkylethylene having a $C_1$-$C_{10}$ perfluoroalkyl group; polytetrafluoroethylene (PTFE); tetrafluoroethylene/perfluoro(alkyl vinyl ether) copolymer (PFA); tetrafluoroethylene/hexafluoropropylene copolymer (FEP); tetrafluoroethylene/perfluoro(alkyl vinyl ether)/hexafluoropropylene copolymer (EPA); polyhexafluoropropylene; ethylene/tetrafluoroethylene copolymer (ETFE); poly trifluoroethylene; polyvinylidene fluoride (PVDF); polyvinyl fluoride (PVF); polychlorotrifluoroethylene (PCTFE); ethylene/chlorotrifluoroethylene copolymer (ECTFE); or a combination thereof.

A fluoro-annealing step as described can be performed at any temperature that is effective to cause fluorine from the fluorine source vapor to react with yttrium oxide of a deposited yttrium oxide coating to convert at least a portion of the deposited yttrium oxide coating to yttrium oxyfluoride, yttrium fluoride, or a combination of these. A relatively high elevated temperature may be useful or preferred, to cause the fluorine source vapor to react with the yttrium oxide to convert the yttrium oxide to a high concentration of yttrium fluoride ($YF_3$) instead of fluorinated yttrium oxide (YOF). Example temperatures of a fluoro-annealing step may be at least 300 or 350 degrees Celsius, or higher, e.g., in a range from 300 to 500 degrees Celsius, such as from 350 or 400 to 425 or 450 degrees Celsius, to produce a high concentration of $YF_3$ at a surface portion of the deposited thin film.

The process chamber can be operated at any useful pressure, with example pressures being approximately atmospheric (760 Torr), e.g., from 100 to 1500 Torr, such as from 250 or 500 to 1000 or 1250 Torr. The atmosphere within the process chamber for converting the yttrium oxide to yttrium fluoride may include a portion that is air, in combination with the molecular fluorine source vapor.

An amount of time used to form yttrium fluoride by a fluoro-annealing step can be based on factors such as temperature of the fluoro-annealing step, the type and amount (concentration) of molecular fluorine source vapor in the process chamber, the thickness and composition of the deposited yttrium oxide coating, and the desired depth of the yttrium oxide coating to which yttrium oxide is desirably converted to yttrium fluoride, yttrium oxyfluoride, or a combination of these. Example amounts of time that are useful or preferred may be in a range of from 1 to 48 hours, e.g., from 2 to 24 hours, or from 3 to 12 hours. A useful period of time for performing a fluoro-annealing step can be a period of time that produces an yttrium fluoride or yttrium oxyfluoride portion (of the deposited yttrium oxide coating) that has a useful or preferred thickness. The thickness will increase over time, during a fluoro-annealing step, with continued exposure of the deposited yttrium oxide coating to the molecular fluorine source vapor. After a certain amount of time, e.g., after 12, 18, or 24 hours, the thickness of the fluorinated portion of the deposited yttrium oxide coating may no longer substantially increase.

A fluorinated yttrium oxide coating as described, formed by converting at least a portion of yttrium oxide of a deposited yttrium oxide coating into yttrium fluoride or yttrium oxyfluoride, will have a composition that includes yttrium, fluorine, oxygen, and possibly a small amount of carbon (e.g., less than 4 or 5 atomic percent carbon), e.g., a fluorinated yttrium oxide coating may contain: yttrium fluoride ($YF_3$), fluorinated yttrium oxide (YOF) (also known as yttrium oxyfluoride), and possibly yttrium oxide ($Y_2O_3$). These different yttrium-containing materials may be present at different portions of the coating in a thickness (depth)

direction, and in amounts (concentrations) (i.e., non-uniform amounts or concentrations) that vary on a basis of a thickness location of the deposited material, i.e., that vary relative to a depth (thickness) of the fluorinated yttrium oxide coating.

The fluorinated yttrium oxide coating can also contain non-yttrium metal, non-yttrium metal oxide, or both, if the yttrium oxide precursor coating is coated to contain non-yttrium metal or non-yttrium metal oxide, e.g., aluminum oxide.

As used herein, the term "fluorinated yttrium oxide coating" refers to a film or coating that is produced on a substrate by depositing an yttrium oxide (precursor) coating onto the substrate, then converting at least a portion of the deposited yttrium oxide to yttrium fluoride or yttrium oxyfluoride. By these steps, not all of the yttrium oxide of the deposited yttrium oxide film will necessarily be converted to yttrium fluoride or yttrium oxyfluoride. A portion of the coating thickness that includes an exposed surface of the coating (i.e., a "surface portion") will be converted to a large extent to yttrium fluoride, yttrium oxyfluoride, or a combination of these. For coatings that have a sufficient thickness, an intermediate or a lower portion of the coating may be converted to yttrium fluoride or to fluorinated yttrium oxide (YOF), and may contain a higher concentration of oxygen compared to locations that are located closer to the surface. Optionally, a lower portion of a coating may be converted to yttrium fluoride, may be converted to fluorinated yttrium oxide, or may remain in the form of yttrium oxide, if the coating has a sufficient thickness.

Based on the method of depositing then fluorinating, the fluorinated yttrium oxide coating, the coating may exhibit a non-uniform, e.g., graded, concentration of one or more of the atomic components that make up the coating, especially fluorine and oxygen. A concentration of fluorine within the fluorinated yttrium oxide coating may decrease along a thickness direction of the coating such that a surface and an outer portion ("upper portion," or "surface portion") of the coating will contain a higher concentration of fluorine compared to portions that are at greater depths. For example, in some embodiments, the coating can have an upper portion that is made substantially of yttrium fluoride, and a lower portion that is fluorinated yttrium oxide, or even non-fluorinated yttrium oxide.

Different portions of a deposited thin film, based on varying composition at different thickness locations of the film, can be identified and described by x-ray photoelectron spectroscopy or "XPS" techniques. These quantitative spectroscopic techniques allow for compositional analysis of a deposited film or layer of material at a surface of the material and below the surface, over a thickness (depth) of the deposited material. The XPS profiling analysis can identify the elemental composition of the deposited material at different locations along the thickness of the material.

A protective coating as described, which contains a combination of at least two different coatings, can be fluorinated in any useful manner, and using one or more separate fluorination steps. Each of the different coatings of a combination can be fluorinated separately (individually, in the absence of the other coating), following deposition of an individual coating, or, alternately a combination of two or more coatings can be first deposited and then fluorinated by a single step that will fluorinate surfaces of the coatings that remain exposed.

In more detail, a combination of coatings as described can include two yttrium oxide coatings on a substrate that includes high aspect ratio surfaces and non-high aspect ratio surfaces. One coating, referred to as a "first" yttrium oxide coating, covers at least high aspect ratio surfaces, and at least one coating, referred to as a "second" yttrium oxide coating, covers at least non-high aspect ratio surfaces. The two coatings may be applied in any desired order, and fluorinated in any desired order. Other coatings may be deposited on the substrate, at different locations relative to the two yttrium oxide coatings, such as a buffer layer.

As used herein, the terms "first" and "second" when referring to a "first yttrium oxide coating" and a "second yttrium oxide coating" are used to indicate that the coated substrate includes at least two different types of yttrium oxide coatings. The terms "first" and "second" do not require one or the other of the two different types of coatings to be deposited onto a substrate in any specific order. The "second" yttrium oxide coating may be deposited in a step that is performed either before or after a step of depositing the "first" yttrium oxide coating. And, the "first" yttrium oxide coating may be deposited in a step that is performed either before or after a step of depositing the "second" yttrium oxide coating. The "second" yttrium oxide coating may be located either over (above) or under (below, i.e., closer to a substrate surface) the "first" yttrium oxide coating. And, the "second" yttrium oxide coating may be located either over (above) or under (below) the "first" yttrium oxide coating. See FIGS. 2B through 2G, which specifically include FIGS. 2C and 2E, showing a "second" PVD coating being deposited before and located beneath a "first" ALD coating.

As a particular example, a first coating may be an applied by atomic layer deposition (ALD) to cover high aspect ratio surfaces as well as non-high aspect ratio surfaces, e.g., this may be an encapsulating coating. Subsequently, a partial coating may be applied to the substrate by a "line of sight" method, such as by physical vapor deposition, to cover non-high aspect ratio surfaces. In some embodiments, the partial coating also covers at least a portion of the high aspect ratio surfaces. As options for fluorinating the coatings, one or two fluorination steps may be used. A first fluorination step may be performed after depositing the first-deposited (e.g., encapsulating) coating, and a second fluorination step may be performed after depositing the second-deposited (e.g., partial) coating. Alternatively, a single fluorination step may be performed after both of the first and second coatings have been deposited.

As a different example, a partial coating may be applied by a "line of sight" deposition method, such as by physical vapor deposition (PVD), to non-high aspect ratio surfaces in a first step. In a subsequent step, an encapsulation coating may be applied, such as by atomic layer deposition. As options for fluorinating the coatings, one or two fluorination steps may be used. A first fluorination step may be performed after depositing the first (e.g., partial) coating, and a second fluorination step may be performed after depositing the second (e.g., encapsulating) coating. Alternatively, a single fluorination step may be performed after both of the first (e.g., partial) coating and the second (e.g., encapsulating) coating are deposited. As described, the partial coating is located at surfaces of the substrate that do not include the high aspect ratio features (e.g., at "primary" surfaces), and the encapsulating coating is deposited at surfaces of the substrate that include surfaces of high aspect ratio features (e.g., at "secondary" surfaces).

Considered differently, a series of steps as described for preparing a substrate that contains surfaces coated with one or more fluorinated yttrium oxide coatings, including at high aspect ratio surfaces and at non-high aspect ratio surfaces, may include steps performed in any useful order that include: depositing onto the substrate an yttrium oxide precursor coating by an atomic layer deposition method, to place the yttrium oxide precursor coating onto high aspect ratio surfaces, and optionally and preferably to place the yttrium oxide precursor coating onto other surfaces of the substrate, including surfaces other than those that are part of the high aspect ratio features; fluorinating the atomic deposition yttrium oxide precursor coating to form a fluorinated yttrium oxide coating at the surfaces of the high aspect ratio features; depositing a partial coating of yttrium oxide onto surfaces of the substrate, over surfaces other than surfaces of the high aspect ratio features, by a "line of sight" method such as physical vapor deposition; and fluorinating the second yttrium oxide coating to form an yttrium fluoride coating. The two different yttrium oxide coatings may be deposited in any order, e.g.: by first depositing the partial coating of yttrium oxide and then depositing the yttrium oxide precursor coating at surfaces of the high aspect ratio features (e.g., as an encapsulating coating over all surfaces of the substrate); or by first depositing the yttrium oxide precursor coating at surfaces of the high aspect ratio features (e.g., as an encapsulating coating over all surfaces of the substrate); followed by depositing the partial coating of yttrium oxide coating at surfaces other than the surfaces of the high aspect ratio features. Fluorinating yttrium oxide of the different coatings may be performed separately on each individual coatings, after deposition, or may be performed as a single fluorination step following the two steps of depositing the two different yttrium oxide coatings.

Referring now to FIG. 1, illustrated is an example of a substrate for use in a semiconductor processing apparatus. Substrate 10 is in the form of an apertured plate or disk of a showerhead (or "electrode"), which is useful to introduce a flow of gaseous fluid from a source of the fluid into an interior space of semiconductor processing apparatus. Apertured plate 10 is shown to be flat, but may also exhibit a curved form. Apertured plate 10 may be made of any useful material, such as a ceramic, a semiconductor material (e.g., silicon), or a metal or metal alloy.

As illustrated, apertured plate 10 includes a front surface 12 that will face an interior of a process chamber during use. A back surface 16 will face a source of the gaseous fluid. During use, gaseous fluid will flow from the source, through apertures 14 of aperture plate 10, and into the interior of the process chamber.

Aperture plated 10 includes front surface 12, which is substantially planar (flat, or slightly curved), back surface 16, and multiple apertures 14. Front surface 12 includes multiple circular boundaries (or common edges) with apertures 14, but is substantially flat or planar and does not include surfaces of a high aspect ratio feature. Accordingly, front surface 12 can be considered a primary surface or a non-high aspect ratio surface, as described herein. Front surface 12 will experience a high amount of contact with process chemicals during use, and can be coated with a protective fluorinated yttrium oxide coating as described, by a deposition method that is adapted to coat an open, exposed primary, non-high aspect ratio surface of a substrate.

Each aperture 14 has an inner aperture surface 18. Each aperture has an aspect ratio that is defined by the thickness of plate 10 per the diameter of each aperture (the aspect ratio of each aperture 14 is t:D. The aspect ratio may be at least 2:1, 5:1, 10:1, or 20:1, or greater. Each aperture 14 is defined by an inner aperture surface 18, which is substantially cylindrical with a diameter "D" and a height (thickness) "t". The inner aperture surfaces 18 are part of the apertures 14, which are three-dimensional structures that can be part of a high aspect ratio feature of substrate 10, and, therefore, can be considered to be secondary surfaces and "high aspect ratio" surfaces of substrate 10. Inner aperture surfaces 18 will also be in an environment of process fluid during use, and can be coated with a protective fluorinated yttrium oxide coating as described. However, inner aperture surfaces 18 are more difficult to coat than front surface 12, because inner aperture surfaces 18 are not entirely accessible by "line-of-sight" deposition methods, especially if the thickness t of plate 10 is substantially greater than diameter D of each aperture. To place a protective fluorinated yttrium oxide coating on inner aperture surfaces 18, a coating method that is capable of depositing a highly conformal coating onto a substrate that includes high aspect ratio surface features (such as apertures 14), by a non-line-of sight method, is preferred, such as atomic layer deposition. Referring now to FIGS. 2A through 2G, example structures and method steps of the present description are illustrated. FIG. 2A shows a legend of yttrium oxide and fluorinated yttrium oxide materials of FIGS. 2B through 2G. For these figures generally, the thicknesses of the coatings and fluorination are not to scale. Typically a PVD coating may be in a range from 50 to 100 times thicker than an ALD coating. The thicknesses of fluorinated portions are also not to scale.

The illustrated example coated substrates all show a PVD coating that is applied to only one side of the substrate. Optionally the PVD coating could be applied to both surfaces by requires flipping the substrate after coating one surface and performing a second coating on the second side.

The illustrated examples show an abrupt termination of the PVD coating between the top surface and the side surface, which is a simplification. In reality, the PVD coating will exhibit a gradual transition from full thickness on the open face surfaces to a reduced thickness or no coating as the coating approaches a boundary with the high aspect ratio feature (e.g., opening 104). Optionally, depending on factors that may include coating conditions, chemical composition of a material being coated, and the form and materials (e.g., previous coatings) of the substrate, a second coating deposited onto a non-high aspect ratio surface (e.g., a PVD coating) may also cover at least a portion of a high aspect ratio feature.

The legend refers to "fluorinated ALD" and "fluorinated PVD." Depending on fluorination conditions (primarily fluorination temperature) a fluorinated ALD coating may contain YOF or $YF_3$, while a fluorinated PVD coating will contain YOF. Consistent therewith, a lower temperature fluorination step may produce PVD YOF and ALD YOF. A higher temperature fluorination step may produce PVD YOF and ALD $YF_3$ on the outer surface.

Because ALD layers may be thin (e.g., around 100 nm), while depending on the fluorination conditions (temperature and time), it is possible to produce a highly fluorinated ALD layer throughout the entire layer thickness; fluorine may access the entire layer from top surface to bottom surface. The fluorine content may have a gradient, however. Potentially, an outer surface or region may be converted to mostly YF3, with gradually increasing amounts of YOF being present farther from the outer surface. ALD alumina as a buffer layer is a barrier for fluorine. The fluorine content will abruptly stop at the ALD alumina buffer layer. PVD Yttria is typically much thicker (5 micron or more) and fluorine will not extend to the entire thickness of a PVD yttria layer.

In each of FIGS. 2B through 2G, an example coated substrate includes multiple yttrium oxide coatings, at least one that covers high aspect ratio surfaces 106, and at least one that covers one or both of opposed non-high aspect ratio surfaces 108 and 110. At least a portion of the exposed (outer) surfaces of the combination of coatings is fluorinated. Optionally, both of the at least two different coatings include a fluorinated surface, but the described coatings and methods do not require that a portion of all yttrium oxide coatings, or that all surfaces of an yttrium oxide coating deposited as a component of a described combination of coatings, include a fluorinated surface. For example, a partial yttrium oxide coating that is covered by a different yttrium oxide coating (e.g., an atomic layer deposition coating) may be part of the combination, but may not include a surface that is exposed to a fluorination step (see FIG. 2B).

Figure 2B:
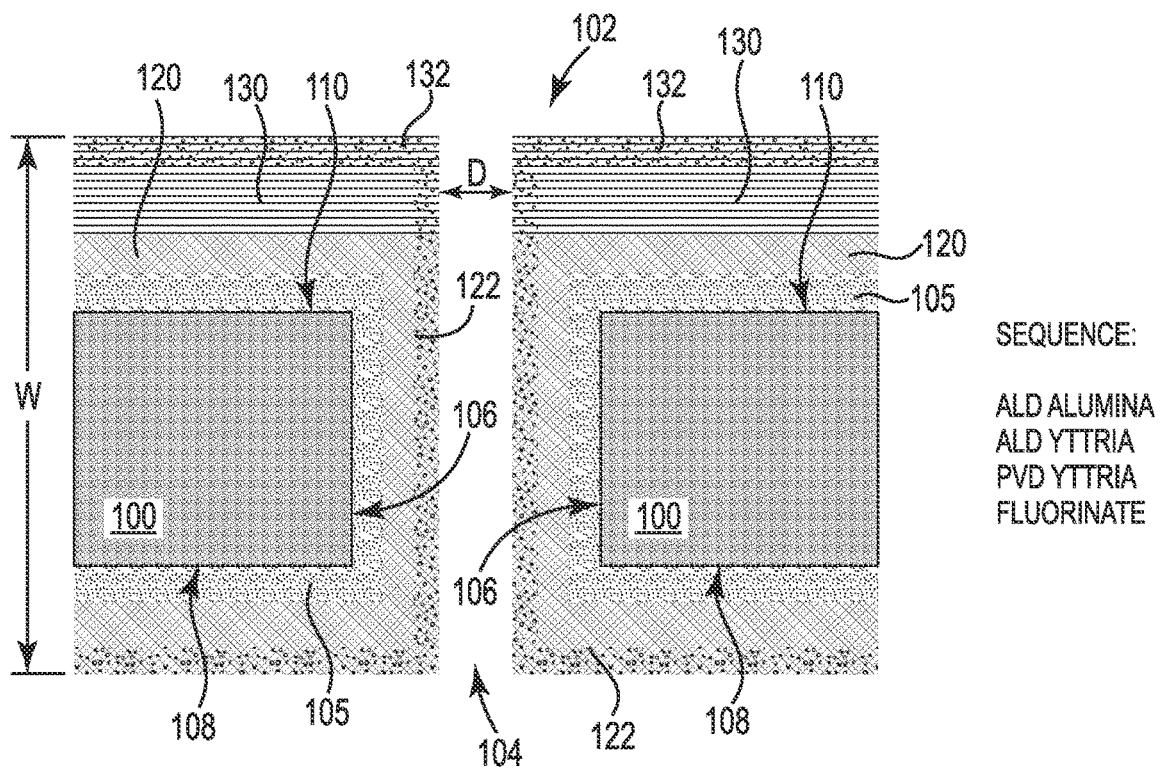
Figure 2C:
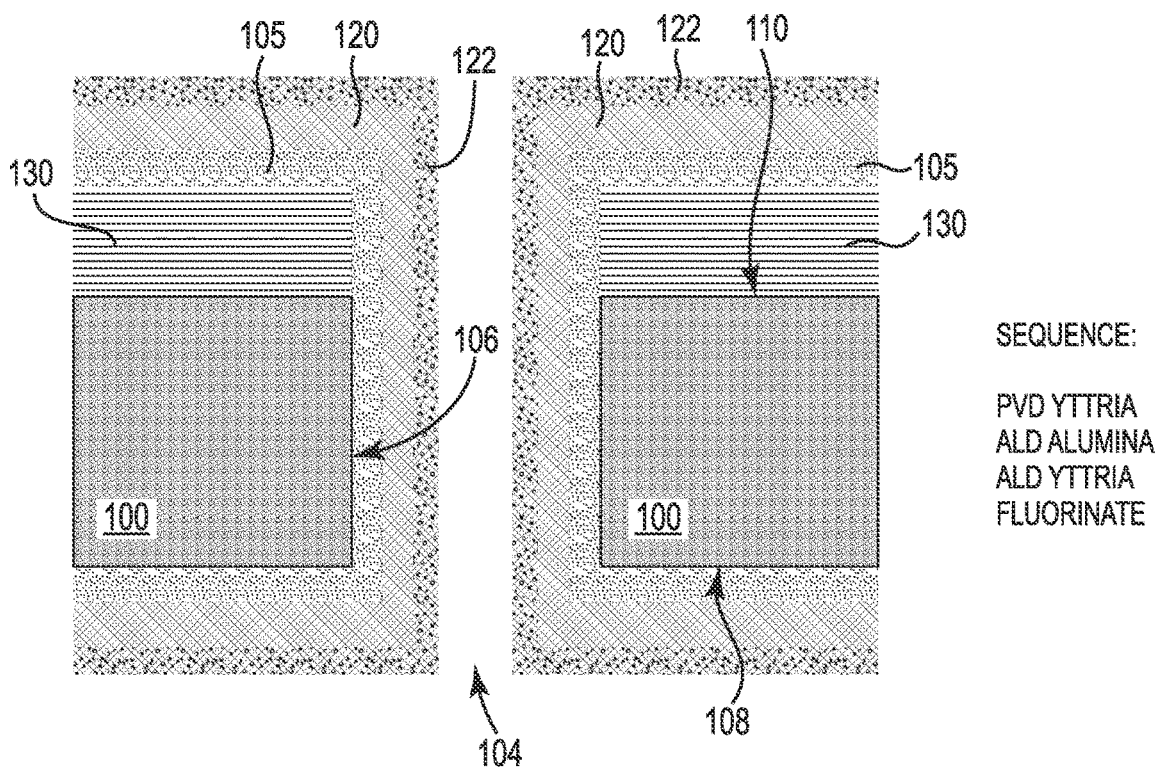

FIG. 2B shows a close-up view of a substrate 100 having high aspect ratio features in the form of multiple apertures 104 (substrate 100 may be a plate 10 of FIG. 1) (only one aperture is illustrated). Substrate 100 includes front face 102 with front surface 110, back surface 108, and multiple apertures 104 (only one is illustrated) that extend fully from front surface 110 to back surface 108. Front surface 110 is substantially planar, does not contain high aspect ratio features, and can be considered to be a primary surface and a non-high aspect ratio surface as described herein.

Each aperture 104 is defined by a diameter D and a width "W," which is equal to a thickness "t" of substrate 100. Each aperture 104 is also defined by an aperture inner surface 106, which, as a surface of a three-dimensional structure (aperture 104) is considered a secondary surface and a high aspect ratio surface, as described herein.

Coated substrate 100 also includes intermediate or "buffer" layer 105 at some or all of the substrate surfaces, including front surface 110, back surface 108, and all aperture inner surfaces 106.

Referring to FIG. 2B, in a first step of an example method as described, alumina buffer layer 105 is deposited by atomic layer deposition directly onto surfaces of substrate 100, including non-high aspect ratio front surface 110, high aspect ratio aperture inner surface 106, and non-high aspect ratio back surface 108. In a second step, yttrium oxide coating 120 is deposited by atomic layer deposition onto substrate 100, over buffer layer 105. Atomic layer deposition yttrium oxide coating 120 completely covers at least inner surfaces 106 of apertures 104. As illustrated, atomic layer deposition yttrium oxide coating 120 covers all surfaces of substrate 100, including front surface 110 and back surface 108. In this example, atomic layer deposition yttrium oxide coating 120 is an encapsulating coating.

Still referring to FIG. 2B, in a subsequent step, partial yttrium oxide coating 130 is deposited onto substrate 100, over yttrium oxide coating 120 previously deposited at front surface 110. Partial coating 130 is located only at front surface 110, and not at back surface 108 or at any of aperture inner surfaces 106. Partial coating 130 may have a thickness that is greater than a thickness of yttrium oxide coating 120. Partial coating 130 can be deposited using any useful deposition method, such as physical vapor deposition, sputtering, plasma enhanced chemical vapor deposition, or the like, which may be a line-of-sight deposition technique.

Still referring to FIG. 2B, by a subsequent step, after depositing yttrium oxide coating 120 by an atomic layer deposition method, and after depositing yttrium oxide coating 130 by a different method, such as a line-of sight method, the substrate coated with the two different types of yttrium oxide coatings (120, 130) is processed by a fluorination step to cause fluorination of the outer surfaces of the combination of coatings. As indicated by fluorinated portion 122 of atomic layer deposition yttrium oxide coating 120, and as indicated by fluorinated portion 132 of physical vapor deposition coating 130 the outer, exposed surfaces of coatings 120 and 130 have been processed by a fluorination step, and at least a portion 122 and 132 of a total amount of yttrium oxide of each of coatings 120 and 130 has been chemically converted to yttrium fluoride.

Note however, that yttrium oxide coating 120 may not be fluorinated at all locations (areas) of the coating. Yttrium oxide coating 130 covers yttrium oxide coating 120 at surfaces 110. The portion of yttrium oxide coating 120 that lies between surface 110 and yttrium oxide coating 130 may be non-fluorinated. But, the portion of the yttrium oxide coating 120 that covers surfaces 106 of the high aspect ratio feature, or other surfaces that are not covered by partial layer 130, will be at least partially fluorinated.

FIG. 2C shows an alternate combination of coatings prepared by alternate steps of producing a coated substrate as described, using figure numbering that is the same as that of FIG. 2A. FIG. 2C shows substrate 100 processed to have two yttrium oxide coatings as described. In a first step, partial yttrium oxide coating 130 is deposited onto substrate 100 at front surface 110. Partial coating 130 is located only at front surface 110, and not at back surface 108 or at any of aperture inner surfaces 106. Partial coating 130 can be deposited using any useful deposition method, such as physical vapor deposition, sputtering, plasma enhanced chemical vapor deposition, or the like, which may be a line-of-sight deposition technique. In a subsequent step, aluminum oxide buffer layer 105 is deposited by atomic layer deposition to cover partial coating 130 and any exposed surfaces of substrate 100, including aperture inner surfaces 106.

Subsequently, yttrium oxide coating 120 is deposited by atomic layer deposition onto substrate 100. Yttrium oxide coating 120 covers at least each inner surface 106 of apertures 104. As illustrated, yttrium oxide coating 120 covers all surfaces of substrate 100, including front surface 110 (previously coated with partial coating 130), and back surface 108. In this example, atomic layer deposition yttrium oxide coating 120 is an encapsulating coating.

Still referring to FIG. 2C, by a subsequent step, after depositing yttrium oxide coating 130 by a method to place the coating over (directly onto) surface 110, and after depositing buffer layer 105 and yttrium oxide coating 120 each by an atomic layer deposition method, the substrate coated with the two yttrium oxide coatings is processed by a fluorination step. As indicated by fluorinated portion 122 of coating 120, at least outer portion 122 of coating 120 has been processed by a fluorination step, and at least a portion of a total amount of yttrium oxide of coating 120 has been chemically converted to yttrium fluoride. Note that partial coating 130, which is covered by buffer layer 105 and by atomic layer deposition yttrium oxide coating 120, may not contain any portion that is converted to a fluorinated portion.

Figure 2D:
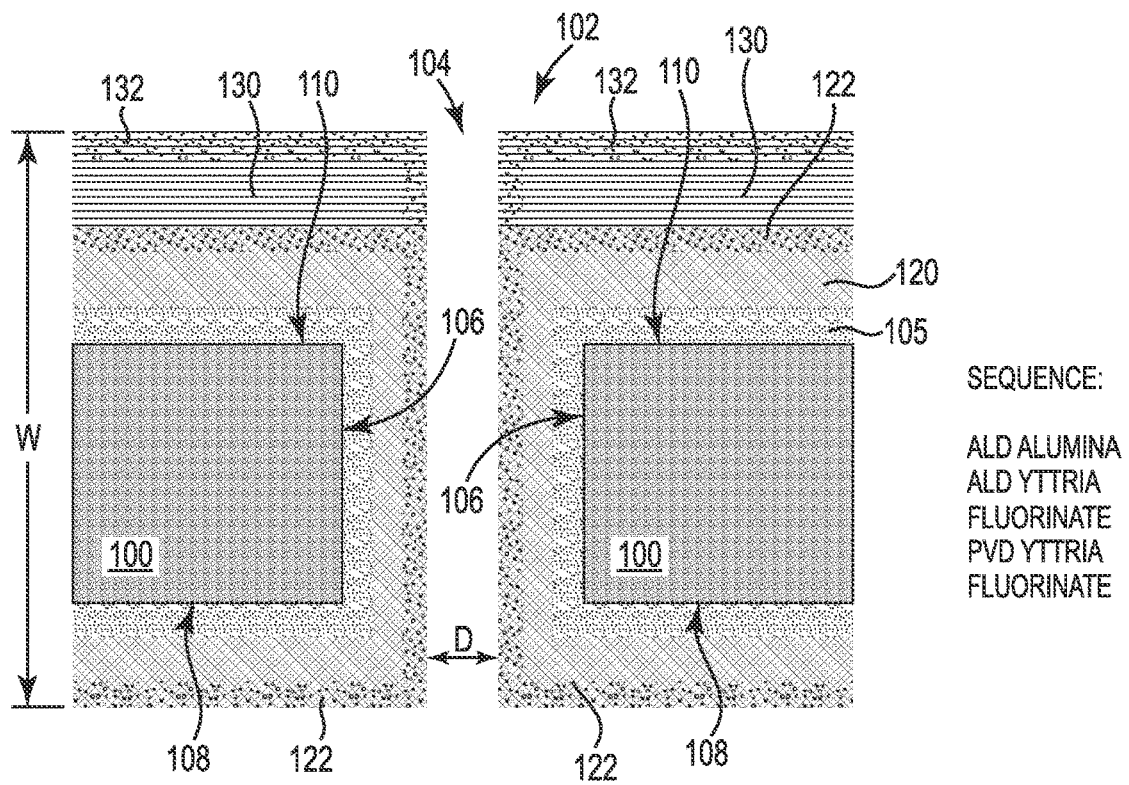
Figure 2E:
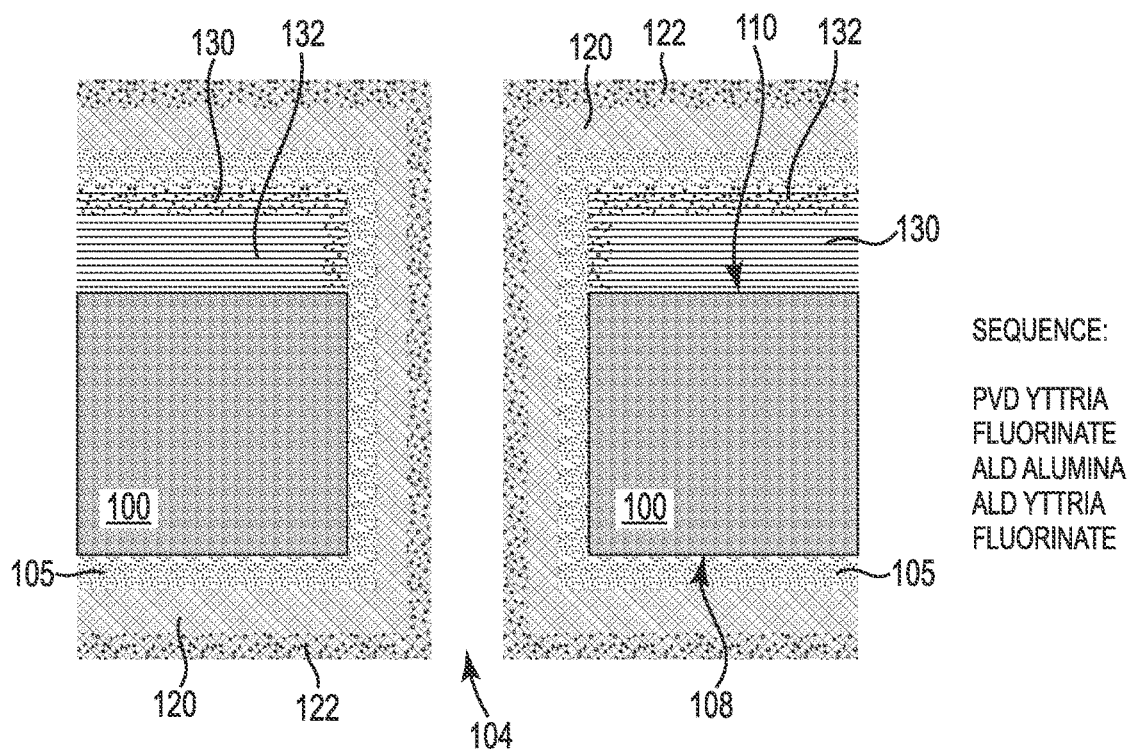

FIG. 2D shows still an alternate coated substrate and steps of producing a coated substrate as described, using figure numbering that is the same as that of FIGS. 2A and 2C. In a first step, buffer layer 105 is deposited by atomic layer deposition. Next, yttrium oxide coating 120 is deposited by atomic layer deposition onto substrate 100 and buffer layer 105. Yttrium oxide coating 120 covers at least each inner surface 106 of apertures 104. As illustrated, yttrium oxide coating 120 covers all surfaces of substrate 100, including front surface 110 and back surface 108; in this example, yttrium oxide coating is an encapsulating coating.

In a fluorination step, yttrium oxide coating 120 is fluorinated to produce fluorinated portion 122.

In a subsequent step, partial yttrium oxide coating 130 is deposited onto substrate 100, over yttrium oxide coating 120 previously deposited at front surface 110. Partial coating 130 is located only at front surface 110, and not at back surface 108 or at any of aperture inner surfaces 106. Partial coating 130 may have a thickness that is greater than a thickness of yttrium oxide coating 120. Partial coating 130 can be deposited using any useful deposition method, such as physical vapor deposition, sputtering, plasma enhanced chemical vapor deposition, or the like, which may be a line-of-sight deposition technique.

In a second fluorination step, yttrium oxide coating 130 is fluorinated. As indicated by portions 122 and 132, each of coating 120 and 130 has been processed by a fluorination step, and at least an outer portion of a total amount of yttrium oxide of each of coatings 120 and 130 has been chemically converted to yttrium fluoride (122, 132).

FIG. 2E shows an alternate coated substrate and steps of producing a coated substrate as described, using figure numbering that is the same as that of FIGS. 2B through 2D. In a first step, partial yttrium oxide coating 130 is deposited onto substrate 100 at front surface 110. Partial coating 130 is located only at front surface 110, and not at back surface 108 or at any of aperture inner surfaces 106. Partial coating 130 can be deposited using any useful deposition method, such as physical vapor deposition, sputtering, plasma enhanced chemical vapor deposition, or the like, which may be a line-of-sight deposition technique.

In a fluorination step, yttrium oxide coating 130 is fluorinated to produce fluorinated portion 132.

By a subsequent step, after depositing yttrium oxide coating 130 by a method to place the coating over surface 110, and after yttrium oxide coating 130 is fluorinated, buffer layer 105 is applied by atomic layer deposition. Subsequently, yttrium oxide coating 120 is deposited by atomic layer deposition onto substrate 100, over buffer layer 105. Yttrium oxide coating 120 covers at least each inner surface 106 of apertures 104. As illustrated, yttrium oxide coating 120 covers all surfaces of substrate 100, including front surface 110 (previously coated with partial coating 130), and back surface 108. In this example, yttrium oxide coating is an encapsulating coating.

In a second fluorination step, yttrium oxide coating 120 is fluorinated to form outer fluorinated portion 122.

Figure 2F:
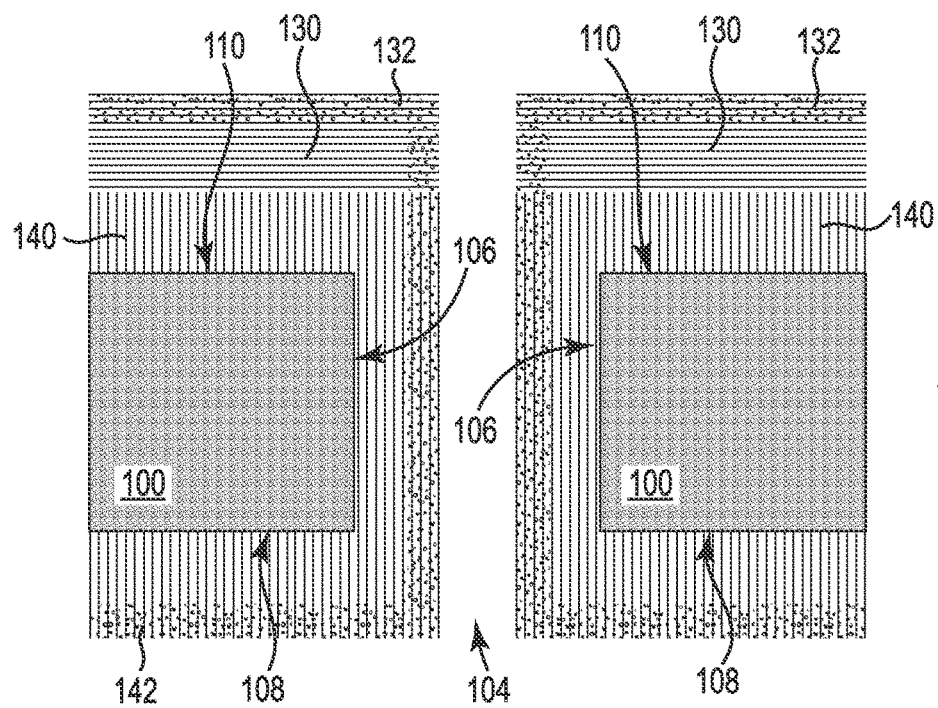

FIG. 2F shows an alternate coated substrate and steps of producing a coated substrate as described, using figure numbering that is the same as that of FIGS. 2B through 2E. In a first step yttria oxide and aluminum oxide composite layer 140 is deposited onto substrate 100 at front surface 110, back surface 108, and inner surfaces 106, by an atomic layer deposition technique. In a subsequent step, partial coating 130 is deposited over front surface 110 by a useful deposition method, such as physical vapor deposition, sputtering, plasma enhanced chemical vapor deposition, or the like, which may be a line-of-sight deposition technique. In a fluorination step, exposed surfaces of partial yttrium oxide coating 130 and composite coating 140 are fluorinated to produce fluorinated portions 132 and 142.

Figure 2G:
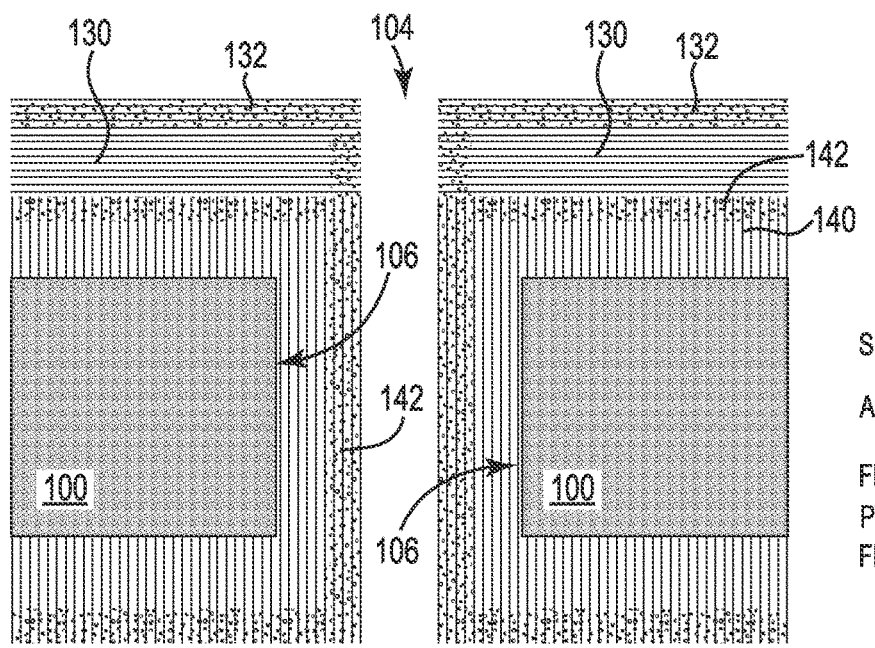

FIG. 2G shows an alternate coated substrate and steps of producing a coated substrate as described, using figure numbering that is the same as that of FIGS. 2B through 2F. In a first step yttria oxide and aluminum oxide composite layer 140 is deposited onto substrate 100 at front surface 110, back surface 108, and inner surfaces 106, by an atomic layer deposition technique. In a first fluorination step, composite coating 140 is fluorinated to produce fluorinated portions 142. In a subsequent step, partial coating 130 is deposited over front surface 110 by a useful deposition method, such as physical vapor deposition, sputtering, plasma enhanced chemical vapor deposition, or the like, which may be a line-of-sight deposition technique. In a second fluorination step, exposed surfaces of partial yttrium oxide coating 130 are fluorinated to produce fluorinated portion 132.

In a first aspect, a coated substrate comprises a substrate comprising high aspect ratio surfaces and non-high aspect ratio surfaces, wherein the high-aspect ratio surfaces are a feature having an aspect ratio of at least 2 to 1; and at least two coatings on the substrate, the coatings comprising: a first yttrium oxide coating that covers high aspect ratio surfaces; and a second yttrium oxide coating that covers non-high aspect ratio surfaces, wherein an outermost portion of the coatings comprises fluorinated yttrium oxide at both high aspect ratio surfaces and non-high aspect ratio surfaces.

A second aspect includes the substrate of aspect 1, wherein the first yttrium oxide coating covers high aspect ratio surfaces and at least a portion of non-high aspect ratio surfaces, and the second yttrium oxide coating covers non-high aspect ratio surfaces and at least a portion of high aspect ratio surfaces.

A third aspect includes the substrate of any previous aspect, wherein the first yttrium oxide coating is an atomic layer deposition coating.

A fourth aspect includes the substrate of any previous aspect, wherein the second yttrium oxide coating is a physical vapor deposition coating.

A fifth aspect includes the substrate of any previous aspect, wherein an outer portion of the first yttrium oxide coating comprises yttrium fluoride, yttrium oxyfluoride, or a composite that includes aluminum oxide and yttrium fluoride or yttrium oxyfluoride.

A sixth aspect includes the substrate of any previous aspect, wherein the first yttrium oxide coating has a thickness in a range from 50 to 500 nanometers.

A seventh aspect includes the substrate of any previous aspect, wherein an outer portion of the second yttrium oxide coating comprises yttrium oxyfluoride.

An eighth aspect includes the substrate of the seventh aspect, wherein the second yttrium oxide coating has a thickness of at least 1 micron.

A ninth aspect includes the substrate of any previous aspect, comprising a non-yttrium-containing buffer layer between the substrate surface and the first yttrium oxide coating, the second yttrium oxide coating, or both.

A tenth aspect includes the substrate of ninth aspect, wherein the buffer layer comprises an atomic layer deposition layer that comprises aluminum oxide.

An eleventh aspect includes the substrate of the ninth or tenth aspect, further comprising: the buffer layer covering high aspect ratio surfaces and non-high aspect ratio surfaces, the first coating covering the buffer layer at high aspect ratio surfaces and non-high aspect ratio surfaces, and the second coating covering the first coating at non-high aspect ratio surfaces.

A twelfth aspect includes the substrate of any previous aspect, comprising: the second yttrium oxide coating deposited onto the non-high aspect ratio surfaces, the first yttrium oxide coating deposited onto the high aspect ratio surface and covering the second yttrium oxide coating.

A thirteenth aspect includes the substrate of the twelfth aspect, comprising a buffer layer deposited over the second yttrium oxide coating.

A fourteenth aspect includes the substrate of any previous aspect, wherein: the substrate comprises: two opposed surfaces each having a length and a width dimension, a thickness between the two opposed surfaces, and an aperture extending between the two opposed surfaces, the aperture comprising a high aspect ratio aperture surface extending along the thickness, and an aperture diameter, and the ratio of the thickness to the aperture diameter (thickness:diameter) is greater than 5:1.

A fifteenth aspect includes the substrate of any previous aspect, wherein the feature has an aspect ratio of at least 10 to 1.

A sixteenth aspect includes the substrate of any previous aspect, wherein the substrate is a process chamber component of a semiconductor processing device.

A seventeenth aspect include the substrate of sixteenth aspect, wherein the substrate is selected from a showerhead or a portion thereof, and an electrode or a portion thereof.

In an eighteenth aspect a method of coating a substrate that includes high aspect ratio surfaces and non-high aspect ratio surfaces comprises: depositing an atomic layer deposition yttrium oxide coating at high aspect ratio surfaces, wherein the high-aspect ratio surfaces are a feature having an aspect ratio of at least 2 to 1, before or after depositing the atomic layer deposition yttrium oxide coating, depositing a non-atomic layer deposition yttrium oxide coating at non-high aspect ratio surfaces, fluorinating exposed surfaces of one or both coatings at high aspect ratio surfaces and at non-high aspect ratio surfaces.

A nineteenth aspect including the method of the eighteenth aspect, wherein the atomic layer deposition coating comprises yttrium oxide or yttrium aluminum oxide, and the method comprises fluorinating an outer portion of the atomic layer deposition coating to produce yttrium fluoride, yttrium oxyfluoride, a combination of yttrium fluoride and aluminum oxide, or a combination of yttrium oxyfluoride and aluminum oxide.

A twentieth aspect including the method of the eighteenth or nineteenth aspects, comprising depositing the non-atomic layer deposition yttrium oxide coating by physical vapor deposition.

A twenty-first aspect including the method of any of the eighteenth through twentieth aspects, wherein: the substrate comprises two opposed surfaces each having a length and a width dimension, a thickness between the two opposed surfaces, and an aperture extending between the two opposed surfaces, the aperture comprising a high aspect ratio aperture surface extending along the thickness, and an aperture diameter, the atomic layer deposition yttrium oxide coating covers the high aspect ratio aperture surface, and the non-atomic layer deposition yttrium oxide coating covers at least a portion of an opposed surface.

A twenty-second aspect including the method of any of the eighteenth through twenty-first aspects, wherein the atomic layer deposition yttrium oxide coating has a thickness in a range of from 50 to 500 nanometers.

The invention claimed is:

1. A coated substrate comprising:
a substrate comprising high aspect ratio surfaces including a feature having an aspect ratio of at least 2 to 1 and non-high aspect ratio surfaces which are not high aspect ratio surfaces; and
at least two coatings on the substrate, the coatings comprising:
a first yttrium oxide coating that covers high aspect ratio surfaces; and
a second yttrium oxide coating that covers non-high aspect ratio surfaces,
wherein an outermost portion of the coatings comprises fluorinated yttrium oxide at both high aspect ratio surfaces and non-high aspect ratio surfaces.

2. The substrate of claim 1, wherein
the first yttrium oxide coating covers high aspect ratio surfaces and at least a portion of non-high aspect ratio surfaces, and
the second yttrium oxide coating covers non-high aspect ratio surfaces and at least a portion of high aspect ratio surfaces.

3. The substrate of claim 1, wherein the first yttrium oxide coating is an atomic layer deposition coating.

4. The substrate of claim 1, wherein the second yttrium oxide coating is a physical vapor deposition coating.

5. The substrate of claim 1, wherein an outer portion of the first yttrium oxide coating comprises yttrium fluoride, yttrium oxyfluoride, or a composite that includes aluminum oxide and yttrium fluoride or yttrium oxyfluoride.

6. The substrate of claim 1, wherein the first yttrium oxide coating has a thickness in a range from 50 to 500 nanometers.

7. The substrate of claim 1, wherein an outer portion of the second yttrium oxide coating comprises yttrium oxyfluoride.

8. The substrate of claim 1, wherein the second yttrium oxide coating has a thickness of at least 1 micron.

9. The substrate of claim 1, comprising a non-yttrium-containing buffer layer between the substrate surface and the first yttrium oxide coating, the second yttrium oxide coating, or both.

10. The substrate of claim 9, wherein the buffer layer comprises an atomic layer deposition layer that comprises aluminum oxide.

11. The substrate of claim 9, further comprising:
the buffer layer covering high aspect ratio surfaces and non-high aspect ratio surfaces,
the first coating covering the buffer layer at high aspect ratio surfaces and non-high aspect ratio surfaces, and
the second coating covering the first coating at non-high aspect ratio surfaces.

12. The substrate of claim 1, comprising:
the second yttrium oxide coating deposited onto the non-high aspect ratio surfaces, and
the first yttrium oxide coating deposited onto the high aspect ratio surface and covering the second yttrium oxide coating.

13. The substrate of claim 1, wherein:
the substrate comprises:
two opposed surfaces each having a length and a width dimension,
a thickness between the two opposed surfaces, and
an aperture extending between the two opposed surfaces, the aperture comprising a high aspect ratio aperture surface extending along the thickness, and an aperture diameter, and
the ratio of the thickness to the aperture diameter (thickness:diameter) is greater than 5:1.

14. The substrate of claim 13, wherein the feature has an aspect ratio of at least 10 to 1.

15. The substrate of claim 13, wherein the substrate is a process chamber component of a semiconductor processing device.

* * * * *